United States Patent
Törker et al.

(10) Patent No.: US 12,385,134 B2
(45) Date of Patent: Aug. 12, 2025

(54) BARRIER LAYER SYSTEM AND METHOD FOR PRODUCING A BARRIER LAYER SYSTEM

(71) Applicant: Fraunhofer-Gesellschaft zur Förderung der angewandten Forschung e.V., Munich (DE)

(72) Inventors: Emmy Törker, Dresden (DE); Franz Selbmann, Chemnitz (DE); Claudia Keibler-Willner, Dresden (DE); Mario Baum, Chemnitz (DE); Maik Wiemer, Chemnitz (DE)

(73) Assignee: Fraunhofer-Gesellschaft zur Förderung der angewandten Forschung e.V., Munich (DE)

( * ) Notice: Subject to any disclaimer, the term of this patent is extended or adjusted under 35 U.S.C. 154(b) by 180 days.

(21) Appl. No.: 17/934,863

(22) Filed: Sep. 23, 2022

(65) Prior Publication Data

US 2023/0077923 A1  Mar. 16, 2023

Related U.S. Application Data

(63) Continuation of application No. PCT/EP2021/057852, filed on Mar. 25, 2021.

(30) Foreign Application Priority Data

Mar. 26, 2020 (DE) .......................... 102020108362.9

(51) Int. Cl.
C23C 16/00 (2006.01)
C23C 16/40 (2006.01)
C23C 16/455 (2006.01)

(52) U.S. Cl.
CPC ...... *C23C 16/45525* (2013.01); *C23C 16/403* (2013.01)

(58) Field of Classification Search
CPC .................. C23C 16/45525; C23C 16/403
See application file for complete search history.

(56) References Cited

U.S. PATENT DOCUMENTS

| 4,383,003 A | 5/1983 | Lifshin et al. |
| 2010/0089636 A1 | 4/2010 | Ramadas et al. |

(Continued)

FOREIGN PATENT DOCUMENTS

EP  3 567 619 A1  11/2019

OTHER PUBLICATIONS

Office Action dated Nov. 30, 2020 for German Patent Application No. 10 2020 108 362.9, (10 pp.), note: pp. 1 and 2 are English language Exglanations to Section C. Result of Determination Document.

(Continued)

*Primary Examiner* — Hai Y Zhang
(74) *Attorney, Agent, or Firm* — Crowell & Moring LLP

(57) ABSTRACT

A layer system includes barrier properties against oxygen and water vapor. There may be an alternating layer system of at least two aluminum oxide layers and at least two titanium oxide layers. The aluminum oxide layers and the titanium oxide layers are deposited alternately on top of one another. The aluminum oxide layers and the titanium oxide layers are deposited by ALD layer deposition with a layer thickness of 5 nm to 20 nm. A first Parylene layer is deposited with a layer thickness of 0.1 μm to 50 μm on a first side of the alternating layer system by CVD.

8 Claims, 3 Drawing Sheets

(56) References Cited

U.S. PATENT DOCUMENTS

2011/0206909 A1 8/2011 Sneh
2017/0130061 A1* 5/2017 Baker .................... B05D 1/00

OTHER PUBLICATIONS

"Atomlagenabscheidung—Wikipedia," de.wikipedia.org, about:reader?url=https://de.wikipedia.org/wiki/Atomlagenabscheidung (9 pp.).

Mats Forssell et al., "Insulation of Thin-Film Parylene-C/Platinum Probes in Saline Solution Through Encapsulation in Multilayer ALD Ceramic Films," Biomedical Microdevices (2018) 20:61, https://doi.org/10.1007/s10544-018-0307-3 (11 pp).

Mats Forsell et al., "Multilayer ALD Ceramic Films for Enhancement of Parylene Barrier Properties in Compliant Neural Probes With Bonded Chips," Solid-State Sensors, Actuators and Microsystems Workshop, Hilton Head Island, South Carolina. Jun. 3-7, 2018 (8 pp.).

Jie Gao et al., "Adhesion Promoter for a Multi-Dielectric-Layer on a Digital Microfluidic Chip," RSC Advances, *RSC Adv.*, 2015, 5, 48626 (5 pp.).

"Parylene—Wikipedia," de.wikipedia.org, about:reader?url=https://de.wikipedia.org/wiki/Parylene (5 pp.).

M. Westerhausen et al., "Characterization of Biostable Atomic Layer Deposited (ALD) Multilayer Passivation Coatings for Active Implants*," 978-1-5386-1311-5/19/$31.00 © 2019 IEEE (4 pp.).

* cited by examiner

BARRIER LAYER SYSTEM AND METHOD FOR PRODUCING A BARRIER LAYER SYSTEM

RELATED APPLICATION

This application is a Continuation of International Patent Application No. PCT/EP2021/057852, filed Mar. 25, 2021, published as WO 2021/191398 A1, which claims priority to German Patent Application 10 2020 108 362.9, filed Mar. 26, 2020. All applications listed in this paragraph are hereby incorporated by reference in their entireties.

TECHNICAL FIELD

The invention relates to a layer system and a method for producing such a layer system, which has barrier properties against oxygen and water vapor.

BACKGROUND

Electronically active materials that are used in a wide variety of electrical assemblies are often very sensitive to moisture and atmospheric oxygen. In order to protect these materials, it is known to encapsulate such assemblies. This is partly done by directly depositing a protective layer on the materials to be protected or by enclosing the assemblies using additional components. For example, solar cells are often protected from moisture and other external influences by glass. Plastic films are also used for encapsulation in order to save weight and to achieve additional degrees of freedom in terms of design. Such plastic films have to be coated for an adequate protective effect. At least one so-called permeation barrier layer (also referred to below as barrier layer) is therefore deposited on them.

Barrier layers sometimes offer very different resistance to different permeating substances. The permeation of oxygen (OTR) and water vapor (WVTR) through the substrates provided with the barrier layer under defined conditions is often used to characterize barrier layers (WVTR according to DIN 53122-2-A; OTR according to DIN 53380-3).

Coating with a barrier layer reduces permeation through a coated substrate relative to an uncoated substrate by a factor that can be in the single-digit range or many orders of magnitude. In addition to specified barrier values, various other target parameters are often expected from a barrier layer. Optical, mechanical, and technological-economic requirements are examples of this. Therefore, barrier layers should often be almost completely transparent in the visible spectral range or beyond. If barrier layers are used in layer systems, it is often advantageous if coating steps for applying individual parts of the layer system can be combined with one another.

So-called PECVD methods (plasma enhanced chemical vapor deposition) are often used to produce barrier layers. These can be used when coating a wide variety of substrates for different layer materials. It is known, for example, to deposit $SiO_2$ and $Si_3N_4$ layers with a thickness of 20 to 30 nm on 13 μm PET substrates [A. S. da Silva Sobrinho et al., J. Vac. Sci. Technol. A 16 (6), November/December 1998, p. 3190-3198]. At a working pressure of 10 Pa, permeation values of WVTR=0.3 g/m2d and OTR=0.5 cm3/m2d can be achieved in this way.

When depositing $SiO_2$ for transparent barrier layers on PET substrates using PECVD, an oxygen barrier of OTR=0.7 cm3/m2d can be realized [R. J. Nelson and H. Chatham, Society of Vacuum Coaters, 34th Annual Technical Conference Proceedings (1991) p. 113-117]. In another source, permeation values in the order of WVTR=0.3 g/m2d and OTR=0.5 cm3/m2d are given for transparent barrier layers for this technology [M. Izu, B. Dotter, S. R. Ovshinsky, Society of Vacuum Coaters, 36th Annual Technical Conference Proceedings (1993) p. 333-340].

Disadvantages of the known PECVD methods consist primarily in the fact that only relatively small barrier effects are achieved. This makes such barrier layers uninteresting, especially for the encapsulation of electrical products. Another disadvantage is the high working pressure compared to the PVD process, which is required to carry out such a process. If such a coating step is to be integrated into complex production processes in vacuum systems, a great deal of effort may be required for pressure decoupling measures. For this reason, a combination with other coating processes is usually uneconomical.

It is also known to apply barrier layers by sputtering. Sputtered individual layers often display better barrier properties than PECVD layers. For example, WVTR=0.2 g/m2d and OTR=1 cm3/m2d are given as permeation values for sputtered AINO on PET [Thin Solid Films, Vol. 388 (2001), p. 78-86]. Numerous other materials are also known which are used in particular by reactive sputtering to produce transparent barrier layers. However, the layers produced in this way also have insufficient barrier effects. Another disadvantage of such layers is their low mechanical strength. Damage caused by technologically unavoidable stress during further processing or use usually leads to a significant deterioration in the barrier effect. This often makes sputtered monolayers unusable for barrier applications. Another disadvantage of sputtered layers is their high cost, which is caused by the low productivity of the sputtering process.

It is also known to vapor-deposit individual layers as barrier layers. Such PVD methods can also be used to deposit different materials directly or reactively on a wide variety of substrates. For barrier applications, for example, the reactive vapor deposition of $Al_2O_3$ on PET substrates is known [Surface and Coatings Technology, Vol. 125 (2000), p. 354-360], where permeation values of WVTR=1 g/m2d and OTR=5 cm3/m2d are achieved. This barrier effect is also far too low to be able to use materials coated in this way as barrier layers for electrical products. They are often even less mechanically resilient than sputtered individual layers. However, the very high coating rates that can be achieved with evaporation processes are an advantage. These are usually 100 times higher than those achieved with sputtering.

It is also known to use magnetron plasmas for plasma polymerization when depositing barrier layers (EP 0 815 283 B1); [So Fujimaki, H. Kashiwase, Y. Kokaku, Vacuum, Vol. 59, (2000), p. 657-664], where PECVD processes are maintained directly by the plasma of a magnetron discharge. An example of this is the use of a magnetron plasma for PECVD coating to deposit layers with a carbon framework, with $CH_4$ serving as the precursor. However, layers of this type also only have an insufficient barrier effect for high requirements.

Furthermore, it is known to apply barrier layers or barrier layer systems in several coating steps. One method of this kind is the so-called PML (polymer multilayer) process [Materials Research Society, (1999), p. 247-254]; [J. D. Affinito, M. E. Gross, C. A. Coronado, G. L. Graff, E. N. Greenweil, and P. M. Martin, Society of Vacuum Coaters, 39th Annual Technical Conference Proceedings, (1996), p. 392-397]. In the PML process, a liquid acrylate film is applied to a substrate using an evaporator, which is then cured using electron beam technology or UV radiation.

This film itself does not have a particularly high barrier effect. The cured acrylate film is then coated with an oxidic intermediate layer, to which an acrylate film is in turn applied. This procedure is repeated several times if necessary. The permeation values of a layer stack produced in this way, i.e., a combination of individual oxidic barrier layers with acrylate layers as intermediate layers, is below the measurement limit of conventional permeation measuring devices. Disadvantages arise here, above all in the necessary use of complex system technology. In addition, a liquid film initially forms on the substrate, which must be cured. This leads to increased plant contamination, which shortens maintenance cycles. In such coating processes, the intermediate layer functioning as a barrier layer is usually produced by means of magnetron sputtering. Here, too, it is disadvantageous that the use of sputtering technology means that a comparatively slow process is used. This results in very high product costs, which stem from the low productivity of the technologies used.

It is also known that the mechanical stability of inorganic vapor-deposited layers can be improved if organic modification is carried out during vaporization. The incorporation of organic components takes place in the inorganic matrix that forms during the layer growth. Evidently, the incorporation of these additional components into the inorganic matrix increases the elasticity of the entire layer, which significantly reduces the risk of fractures in the layer. In this context, a combination process that combines electron beam evaporation of SiOx with the inlet of HMDSO (DE 195 48 160 C1) should be mentioned as being suitable at least for barrier applications. However, the low permeation rates required for electrical components cannot be achieved with layers produced in this way.

SUMMARY

The solution to the technical problem is achieved by the subject matter of the embodiments. The embodiments are therefore based on the technical problem of creating a barrier layer system and a method for producing such a barrier layer system with which the problems from prior art can be overcome. In particular, the barrier layer system should have a high barrier effect against oxygen and water vapor. The barrier layer system should bring about a barrier effect both on substrates with flat surfaces, such as plastic films, and on substrates with a profiled surface structure, as is the case with semiconductor components, for example. Furthermore, the barrier layer system should be able to be used as a flexible substrate, have optical transparency and be biocompatible.

A layer system according to the invention with barrier properties against oxygen and water vapor initially comprises an alternating layer system consisting of aluminum oxide layers and titanium oxide layers, in which the aluminum oxide layers and the titanium oxide layers are deposited alternately on top of one another. The aluminum oxide layers and the titanium oxide layers each have a layer thickness of 5 nm to 20 nm. In order to achieve an adequate barrier effect, the alternating layer system of a layer system according to the invention consists of at least two aluminum oxide layers and at least two titanium oxide layers, which are deposited alternately on top of one another. The barrier effect of a layer system according to the invention can be further increased if more than two aluminum oxide layers and two titanium oxide layers are alternately deposited one above the other within the alternating layer system. For economic reasons, it is not practical to alternately deposit more than six aluminum oxide layers and six titanium oxide layers one on top of the other.

Furthermore, a layer system according to the invention comprises a first Parylene layer deposited on a first side of the alternating layer system, which has a layer thickness of 0.1 µm to 50 µm. The first Parylene layer preferably has a layer thickness of 1 µm to 10 µm. This layer thickness range satisfies both requirements with regard to good barrier properties of the layer and the cost-effectiveness of the layer deposition process.

In the method according to the invention for producing a layer system which has barrier properties against oxygen and water vapor, an alternating layer system is first formed in which at least two aluminum oxide layers and at least two titanium oxide layers are deposited alternately on top of one another. According to the invention, a known process of atomic layer deposition is used to deposit the aluminum oxide layers and the titanium oxide layers, for which the abbreviation "ALD" is also used, based on the technical term "atomic layer deposition". The aluminum oxide layers and titanium oxide layers deposited by means of ALD in the method according to the invention are therefore collectively referred to below as ALD layers.

In an ALD process, at least one precursor is usually introduced into a first working chamber, as a result of which functional groups of the precursor react with the surface of a substrate arranged in the working chamber, as a result of which a layer is formed on the surface of the substrate. With this approach, very thin layers can be formed on a substrate surface.

The deposition of an aluminum oxide layer by means of ALD for a layer system according to the invention is preferably carried out by means of two precursors. In this case, a first precursor is first introduced into the first working chamber, from which molecules adhere to the surface of a substrate to be coated. The molecules of the first precursor not adhering to the substrate surface or the working chamber walls are removed from the first working chamber by means of a flushing gas. A second precursor is then introduced into the first working chamber, with molecules of the second precursor reacting with the molecules of the first precursor adhering to the surface of the substrate to be coated and consequently forming a layer on the surface of the substrate to be coated. Trimethylaluminum and water, for example, are suitable as first and second precursors for forming an aluminum oxide layer by means of ALD for a layer system according to the invention.

Analogously, a titanium oxide layer is also formed using two precursors in the method according to the invention. Titanium tetrachloride and water, for example, can be used as the first and second precursors.

One requirement of a layer system according to the invention is that it has barrier properties with regard to oxygen and water vapor. It is therefore necessary for the individual ALD layers of the alternating layer system of a barrier layer system according to the invention to be deposited as completely closed layers if possible. In the method according to the invention, therefore, both the aluminum oxide individual layers and the titanium oxide individual layers of the alternating layer system are deposited with a layer thickness of at least 5 nm in each case. With such a minimum layer thickness, closed layers are formed in the aluminum oxide layers and the titanium oxide layers. To form an aluminum oxide layer that is at least 5 nm thick or a titanium oxide layer that is at least 5 nm thick, the work steps described above for depositing the two layers can also be carried out several times in succession in each case until a layer thickness of at least 5 nm is achieved for an aluminum oxide layer or titanium oxide layer to be deposited.

Since the barrier properties cannot be increased at will with increasing layer thickness of the ALD layers, in one embodiment both the aluminum oxide individual layers and the titanium oxide individual layers of the alternating layer system of a barrier layer system according to the invention are deposited with a layer thickness of 5 nm to 20 nm each.

In an embodiment, the ALD layers are deposited with a layer thickness of 5 nm to 10 nm. In this layer thickness range, closed aluminum oxide layers and closed titanium oxide layers with good barrier properties are formed and, additionally, it is advantageous from an economic point of view and/or with functional requirements, such as transparency of the layer system with regard to light radiation, if the individual layers of the alternating layer system are not too thick.

In a further embodiment, in an alternating layer system, first an aluminum oxide layer and, only then, a titanium oxide layer are formed on a substrate.

For layer-forming chemical reactions in ALD layer deposition processes, it is advantageous if temperatures above room temperature are set within a working chamber selected for the ALD layer deposition process, it usually being more advantageous for supporting the chemical reactions the higher the temperature is set. How high the temperature in the working chamber is set depends, among other things, on the material of a substrate to be coated and its temperature resistance.

In one embodiment, temperatures of at least 60° C. are set within a first working chamber selected for the ALD processes for depositing the aluminum oxide layers and the titanium oxide layers. How high the temperature in the working chamber is set above 60° C. depends, among other things, on the material of a substrate to be coated and its sensitivity to temperature. The temperature inside the first working chamber can be increased to a temperature of at least 60° C., for example by means of a radiant heater. Furthermore, it is possible to form a substrate carrier, on which a substrate to be coated with the ALD layers is located, with a heating element, such as a heating plate.

In a further embodiment, the temperature within the first working chamber is set to a temperature in the range from 60° C. to 130° C. Within this temperature range, temperature-sensitive substrates such as plastic films can be coated, and additionally a high deposition rate can be set in this temperature range.

In an embodiment, the temperature within the first working chamber is set to a temperature in the range of 80° C. to 120° C. In this temperature range, low-defect aluminum oxide and titanium oxide layers are deposited at high process speeds using ALD.

In order to complete a layer system according to the invention, a first Parylene layer with a layer thickness of 0.1 μm to 50 μm and preferably with a layer thickness of 1 μm to 10 μm is deposited at least on a first side of the alternating layer system of aluminum oxide and titanium oxide layers in the method according to the invention. A known process of chemical vapor deposition is selected as the layer deposition method, which is in reference to the technical term "Chemical Vapor Deposition", or "CVD" for short, and which is disclosed, for example, in U.S. Pat. No. 3,556,881 A. The CVD deposition process for the Parylene layer is preferably performed at room temperature. Such a CVD deposition process for a Parylene layer runs stably at temperatures of −40° C. to 40° C., and thus in particular also at room temperature, and therefore represents an economical deposition process that does not require any additional effort for cooling or heating a substrate to be coated. In one embodiment, therefore, the Parylene layer is deposited at temperatures ranging from 20° C. to 40° C.

Due to the different temperature requirements when depositing the ALD layers on the one hand and the Parylene layer on the other hand, the Parylene layer can preferably be deposited within a second working chamber, which differs from the first working chamber in which the alternating layer system is deposited. Alternatively, the alternating layer system and the Parylene layer can also be deposited within a working chamber if the working chamber comprises, among other things, means with which the different temperature requirements required for the ALD processes and the CVD process can be set within the working chamber.

Various types of Parylene, each with different substituents, are particularly suitable as the Parylene layer (poly-para-xylylene), such as Parylene C/poly(chloro-p-xylylene); Parylene F/poly(tetrafluoro-p-xylylene); Parylene AF4/poly (α, α, α', α'-tetrafluoro-p-xylylene); Parylene N/poly(p-xylylene); Parylene D/poly(dichloro-p-xylylene) or a mixed form of at least two of the Parylene embodiments listed above. The precursors for the Parylene types mentioned are commercially available. Alternatively, a Parylene layer can also consist of Parylene types other than those mentioned, i.e., Parylene types with other substituents such as, for example, bromine, alkyl, acyl, amino or methylamino, aldehyde, cyano, and ethynyl groups.

A Parylene layer made of Parylene C represents a very economical embodiment. Such a layer causes only low precursor costs, enables a very good process yield, presents a very good barrier effect, and has biocompatibility certified according to ISO 10993. However, the temperature resistance of such a layer is only moderate.

The Parylene F layering material causes higher precursor costs, leads to a lower process yield than Parylene C, presents a lower barrier effect than Parylene C and D, has no certified biocompatibility, but has better temperature resistance than Parylene C.

Parylene AF4 also causes higher precursor costs with a lower process yield than Parylene C, presents a lower barrier effect than Parylene C and D, but has better temperature resistance than Parylene F and has certified biocompatibility.

The Parylene type Parylene N requires higher precursor costs with a lower process yield compared to Parylene C, has a lower barrier effect than Parylene C, D, F, and AF4, has only a lower temperature resistance than Parylene C, but has certified biocompatibility and is also halogen-free.

A Parylene layer made of Parylene D can usually only be deposited with a low process yield, but has better temperature resistance than Parylene C, causes higher precursor costs, and also has no certified biocompatibility.

The adhesion of the at least one Parylene layer to the previously deposited alternating layer system of aluminum oxide and titanium oxide layers can be improved if an adhesion promoter layer is deposited between the alternating layer system and the at least one Parylene layer or the alternating layer system is treated with a surface treatment, such as a plasma. In a layer system according to the invention, a silicon-containing layer based on a silane or a silane derivative is preferably deposited as an adhesion promoter layer. A suitable silane is, for example, 3-methacryloyloxypropyltrimethoxysilane. As a result of chemical layer deposition, a silane layer and thus a silicon-containing layer is formed on the surface of the alternating layer system, which improves the adhesion of a subsequently deposited Parylene layer.

It was previously described that a barrier layer system according to the invention is deposited on a substrate and can be used, for example, for encapsulating electrical components, which can also have a structured or three-dimensionally shaped surface. However, a layer system according to the invention can itself also be used as a flexible substrate which has barrier properties with regard to oxygen and water vapor. For this purpose, however, at least one Parylene layer is deposited on each of the two sides of the alternating layer system.

Such a layer system according to the invention with barrier properties against oxygen and water vapor can be produced, for example, as follows: At least a first Parylene layer is first deposited on a substrate by means of CVD, then an alternating layer system of aluminum oxide and titanium oxide layers is deposited by means of ALD and then again at least a second Parylene layer is deposited by means of CVD. Finally, the substrate is removed from the layer stack. Such a layer system according to the invention is pliable and therefore flexible, is characterized by very good barrier properties with regard to oxygen and water vapor, and can therefore be used as a flexible substrate with barrier properties.

In such an application, it is advantageous to form the at least one first Parylene layer and/or the at least one second Parylene layer with a layer thickness greater than 5 µm in order to give the layer system the required inherent stability.

In this embodiment too, an adhesion promoter layer can be formed between the alternating layer system and the at least one first Parylene layer and/or the alternating layer system and the at least one second Parylene layer. A silicon-containing layer, as described above, can in turn be used as the adhesion-promoting layer. The first Parylene layer, the second Parylene layer and the silicon-containing adhesion promoter layers are preferably deposited in one working chamber and the aluminum oxide and titanium oxide layers are deposited in another working chamber.

So that the substrate can be better separated from the layer stack after all layers have been deposited, it is advantageous if, before the first Parylene layer is deposited, a release agent is applied to the substrate or a so-called sacrificial layer is deposited on the substrate, which is destroyed when the substrate is separated from the layer stack. As materials for a release agent or a sacrificial layer, for example, surfactants, polymers (such as photoresists or polyvinyl alcohol), or oxides (such as silicon oxide) are suitable. In order to separate the substrate from the stack of layers, the stack of layers can for example be pulled off the substrate mechanically. For example, a glass or a semiconductor wafer can be used as the substrate. Alternatively, the sacrificial layer used can be removed using a suitable solvent. If, for example, polyvinyl alcohol is used as a release agent or as a sacrificial layer, water can for example be used as a solvent.

In summary, it should be stated once again that one embodiment of a layer system according to the invention with barrier properties with regard to oxygen and water vapor is an alternating layer system consisting of two to six aluminum oxide layers and two to six titanium oxide layers, which are arranged on top of one another so as to alternate and come directly one after the other (i.e. without further intermediate layers), and comprises at least one Parylene layer, wherein the Parylene layer is either deposited directly on one side of the alternating layer system or wherein only an adhesion promoter layer is arranged between the Parylene layer and the alternating layer system.

As an alternative embodiment, it is also possible to deposit several previously described alternating layer systems on top of one another, between which at least one Parylene layer is formed in each case.

BRIEF DESCRIPTION OF THE DRAWINGS

The present invention is explained in more detail below using exemplary embodiments. In the drawings.

DETAILED DESCRIPTION

Figure 1:
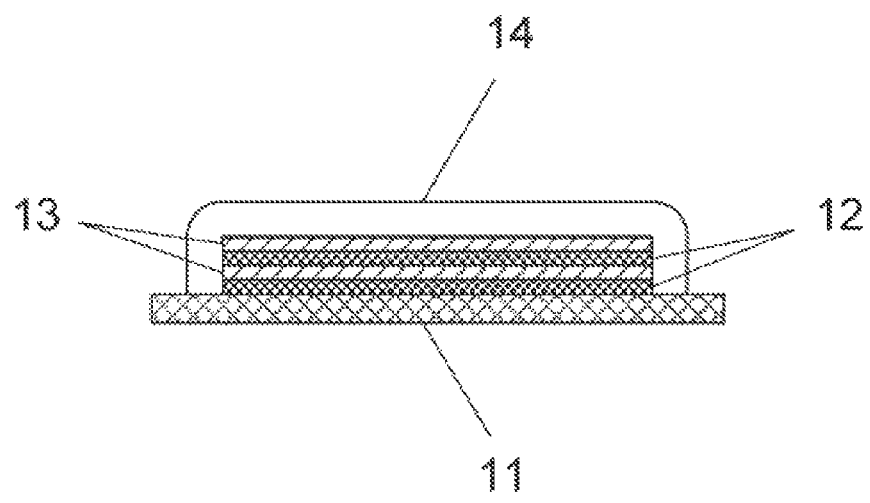
FIG. 1 is a schematic sectional view of a layer system deposited on a substrate.

In FIG. 1, a layer system according to the invention deposited on a substrate 11 is shown schematically in a sectional view. The layer system according to the invention initially comprises an alternating layer system consisting of two aluminum oxide layers 12 and two titanium oxide layers 13, which were deposited alternately on top of one another on the substrate 11. The alternating layer system of a barrier layer system according to the invention can comprise up to six aluminum layers 12 and up to six titanium oxide layers 13, which are deposited alternately on top of one another. The individual layers have a layer thickness of 5 nm to 20 nm in each case. For example, a plastic film, a glass, a semiconductor wafer, or an electrical component such as an integrated circuit can be used as the substrate 11.

The alternating deposition of the aluminum oxide layers 12 and the titanium oxide layers 13 took place in a first working chamber using known ALD deposition processes. During layer deposition, temperatures above 60° C. are set in the first working chamber. In a second working chamber, a Parylene layer 14 is then deposited on the alternating layer system, consisting of the aluminum oxide layers 12 and the titanium oxide layers 13, with a layer thickness of 0.1 µm to 50 µm using a known CVD deposition process. Alternatively, a layer system according to the invention can also have a plurality of Parylene layers 14 deposited directly on top of one another.

Both aluminum oxide and titanium oxide layers deposited by means of ALD and Parylene layers deposited by means of CVD are distinguished by the fact that they can also be deposited area-wide on structured surfaces and three-dimensional objects. A further advantage of a layer system according to the invention is that a Parylene layer deposited by means of CVD also covers the side edges of underlying layers and, if necessary, even the entire substrate, including its rear side. A layer system according to the invention therefore has very good barrier properties with respect to oxygen and water vapor and is therefore also particularly well suited for encapsulating electrical components which usually have a structured surface. Such an electrical component can, for example, comprise at least one semiconductor component and/or at least one organic component. In this case, in one embodiment, a layer system according to the invention can be deposited directly on the electrical component. In relation to the exemplary embodiment described with reference to FIG. 1, the substrate 11 is then designed as an electrical component. Alternatively, in such an application, the substrate 11 can also be provided in the form of a plastic film, in which case the plastic film coated with the layer system according to the invention is then used as an encapsulation film for an electrical component.

In a further alternative embodiment, an electrical component can also be produced on a substrate, the substrate being formed as a barrier layer system according to the invention and the substrate with the electrical component located thereon then being encapsulated by means of a further barrier layer system according to the invention.

Figure 2:
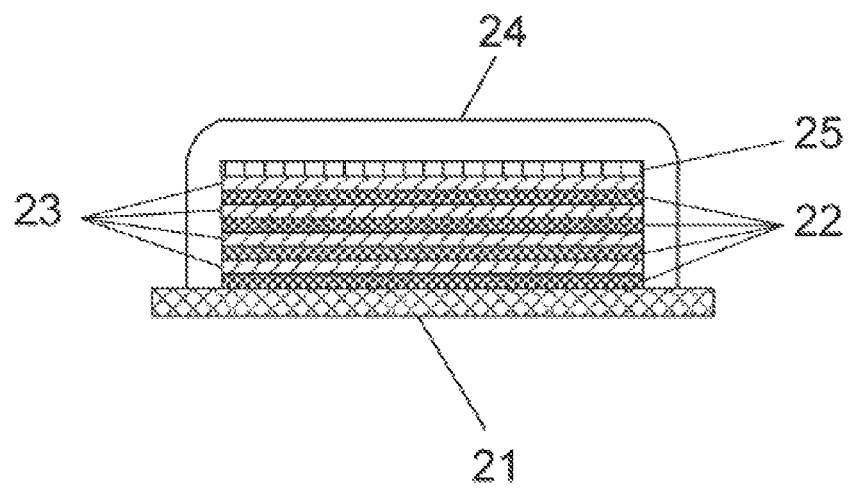
FIG. 2 is a schematic sectional view of an alternative layer system deposited on a substrate.

An alternative layer system according to the invention, which is deposited on a substrate 21, is shown schematically in a sectional view in FIG. 2. In this exemplary embodiment, the substrate 21 is designed as a plastic film consisting of the material polyethylene naphthalate (abbreviation "PEN"). The alternative layer system according to the invention from FIG. 2 initially comprises an alternating layer system consisting of four aluminum oxide layers 22 and four titanium oxide layers 23, which were deposited alternately on top of one another on the substrate 21 with a layer thickness of 5 nm each. According to the invention, the aluminum oxide and titanium oxide layers were deposited using ALD within a first working chamber. An adhesion promoter layer 25 was then produced on the alternating layer system, which ensures better adhesion to a Parylene layer 24 that is subsequently deposited and is 2 μm thick. The Parylene layer 24, consisting of Parylene C, is preferably deposited in a second working chamber by means of CVD. A silicon-containing layer in the form of a silane layer was produced as the adhesion promoter layer 25 by introducing a silane as a precursor into the second working chamber before the Parylene layer 24 was deposited. In the layer stack described for FIG. 2, consisting of the PEN substrate 21, the alternating layer system of aluminum oxide layers 22 and titanium oxide layers 23, the adhesion promoter layer 25, and the Parylene layer 24, a barrier with regard to WVTR of <6.6*10−6 g/(m2d) can be determined at ambient conditions of 38° C. and 90% humidity. Very good barrier properties could thus be demonstrated in a layer system according to the invention.

Figure 3A:
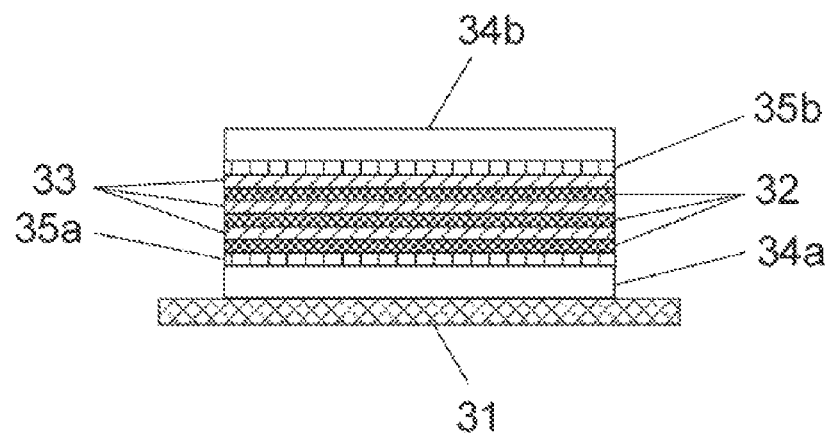
FIG. 3a, 3b are schematic sectional representations of a further alternative layer system.
Figure 3B:
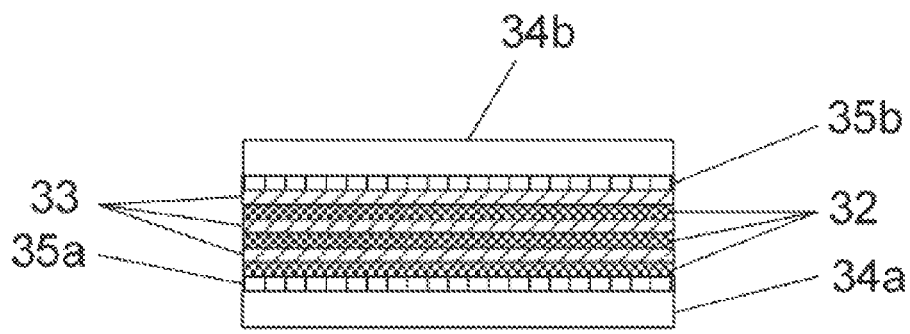

A further alternative layer system according to the invention with barrier properties with regard to oxygen and water vapor is shown schematically in a sectional view in FIGS. 3a and 3b. The layer system according to FIGS. 3a and 3b initially comprises an alternating layer system consisting of three aluminum oxide layers 32 and three titanium oxide layers 33, which are arranged alternately on top of one another. A first Parylene layer 34a is formed on one side of the alternating layer system and a second Parylene layer 34b is formed on the other side of the alternating layer system, with a first adhesion promoter layer 35a being deposited between the first Parylene layer 34a and the alternating layer system and a second adhesion promoter layer 35b being deposited between the second Parylene layer 34b and the alternating layer system. Such a layer system according to the invention can be used as a flexible substrate and at the same time has barrier properties with regard to oxygen and water vapor.

When producing the layer system shown in FIGS. 3a and 3b, the Parylene layer 34a is first deposited on a substrate 31 within a working chamber by means of CVD. The optional adhesion promoter layer 35a can also be deposited in the same working chamber, for example by introducing a silane into the working chamber. The aluminum oxide layers 32 and the titanium oxide layers 33 are then produced alternately by means of ALD in a second working chamber. In a further method step, the adhesion promoter layer 35b and the Parylene layer 34b are then deposited again in the working chamber suitable for CVD processes. To form the adhesion-promoting layer 35b, the same method steps are preferably used as for forming the adhesion-promoting layer 35a. Finally, the substrate 31 is separated from the rest of the layer stack by the layer stack for example being pulled off the substrate 31. A semiconductor wafer or a glass, for example, can be used as the substrate 31.

The separation of the substrate 31 from the remaining layer stack can be simplified if a release agent is applied to the substrate 31 or a sacrificial layer is deposited on the substrate 31 before the Parylene layer 34a is deposited. A solution containing surfactants, for example, can be applied to the substrate 31 as a release agent.

The invention claimed is:

1. A layer system with barrier properties against oxygen and water vapor, comprising:
    alternating layers comprising at least two aluminum oxide layers and at least two titanium oxide layers, in which the aluminum oxide layers and the titanium oxide layers are alternately deposited on top of one another, wherein the aluminum oxide layers and the titanium oxide layers each have a layer thickness of 5 nm to 20 nm and wherein each alternately deposited aluminum or titanium oxide layer directly contacts an adjacent alternately deposited titanium or aluminum oxide layer; and
    at least one first Parylene layer deposited on a first side of the alternating layers, the Parylene layer having a layer thickness of 0.1 μm to 50 μm.

2. The layer system according to claim 1, further comprising:
    at least one second Parylene layer with a layer thickness of 0.1 μm to 50 μm is formed on a second side of the alternating layers.

3. The layer system according to claim 2, further comprising:
    a silicon-containing layer formed between the alternating layers and the at least one second Parylene layer.

4. The layer system according to claim 2, wherein the at least one first Parylene layer and/or the at least one second Parylene layer comprises at least one material from the group of: Parylene C/poly(chloro-p-xylylene); Parylene F/poly(tetrafluoro-p-xylylene); Parylene AF4/poly(α, α, α', α'-tetrafluoro-p-xylylene); Parylene N/poly(p-xylylene); or Parylene D/pol (dichloro-p-xylylene).

5. The layer system according to claim 1, wherein the layer system is deposited on a substrate.

6. The layer system according to claim 5, wherein the substrate comprises a plastic film, a glass, or a semiconductor wafer.

7. The layer system according to claim 5, wherein the substrate comprises at least one semiconductor component and/or at least one organic component.

8. The layer system according to claim 1, wherein a silicon-containing layer is formed between the alternating layers and the at least one first Parylene layer.

* * * * *